US012689286B2

(12) United States Patent
Tsou et al.

(10) Patent No.: US 12,689,286 B2
(45) Date of Patent: Jul. 21, 2026

(54) GATE DRIVER CONTROL FOR HIGH FREQUENCY SWITCHING CONVERTER

(71) Applicant: Monolithic Power Systems, Inc., Kirkland, WA (US)

(72) Inventors: Wen-Jie Tsou, New Taipei City (TW); Bor-Tsang Hwang, New Taipei City (TW); Yu-Huei Lee, New Taipei City (TW); Haoyang You, San Jose, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 39 days.

(21) Appl. No.: 18/981,159

(22) Filed: Dec. 13, 2024

(65) Prior Publication Data

US 2025/0202344 A1     Jun. 19, 2025

Related U.S. Application Data

(60) Provisional application No. 63/610,640, filed on Dec. 15, 2023.

(51) Int. Cl.
| | |
|---|---|
| *H02M 1/088* | (2006.01) |
| *H02M 3/157* | (2006.01) |
| *H02M 3/158* | (2006.01) |
| *H03K 17/687* | (2006.01) |
| *H03K 4/06* | (2006.01) |
| *H03K 7/08* | (2006.01) |

(52) U.S. Cl.
CPC ........... *H02M 1/088* (2013.01); *H02M 3/157* (2013.01); *H02M 3/158* (2013.01); *H03K 17/6871* (2013.01); *H03K 4/06* (2013.01); *H03K 7/08* (2013.01)

(58) Field of Classification Search
CPC ...... H02M 1/088; H02M 3/157; H02M 3/158; H03K 17/6871
USPC .................................................. 327/108–112
See application file for complete search history.

(56) References Cited

U.S. PATENT DOCUMENTS

2025/0175089 A1* 5/2025 Zhang ................. H02M 1/0009

* cited by examiner

*Primary Examiner* — Tomi Skibinski
(74) *Attorney, Agent, or Firm* — Perkins Coie LLP

(57) ABSTRACT

A gate driver circuit includes a high side driver circuit, a low side driver circuit, and an on-time control circuit. The high side driver circuit provides a first gate driving signal to a high side power switch. The low side driver circuit provides a second gate driving signal to a low side power switch. The on-time control circuit is configured to provide the first on-time adjusting signal in response to the first on-time control signal and the second feedback signal. The on-time of the first on-time adjusting signal is greater than the on-time of the first on-time control signal. The on-time control circuit is further configured to provide the second on-time adjusting signal in response to the second on-time control signal and the second feedback signal. The on-time of the second on-time adjusting signal is greater than the on-time of the second on-time control signal.

24 Claims, 4 Drawing Sheets

100

500

600

620

700

720

GATE DRIVER CONTROL FOR HIGH FREQUENCY SWITCHING CONVERTER

CROSS-REFERENCE TO RELATED APPLICATION(S)

The present application claims the benefit of and priority to a U.S. Provisional Patent Application Ser. 63/610,640 filed Dec. 15, 2023, which is hereby incorporated fully by reference into the present application.

TECHNICAL FIELD

The present disclosure relates generally to power circuits, and more particularly but not exclusively to switching converters.

BACKGROUND OF THE INVENTION

Power converters such as switch mode voltage regulators are widely used to provide power to electronic devices. For example, a buck converter includes two power switches and an inductor, and is configured to covert an input voltage into an output voltage. Specifically, the first terminal of the high side power switch is coupled to a voltage source (e.g., input voltage terminal Vin), the second terminal of the high side power switch is coupled to the first terminal of the low side power switch (e.g., switching terminal SW), the second terminal of the low side power switch is coupled to a reference ground. An output capacitor is coupled to an output voltage terminal Vout to filter an output voltage. A gate driver circuit is configured to provide the gate driving signal to the two power switches. The gate driving circuit receives a Pulse-Width Modulation (PWM) control signal, and provides a first gate driving signal to the control terminal of the high side power switch and a second gate driving signal to the control terminal of the low side power switch based on the PWM control signal. The high side power switch is turned on and turned off alternately in response to the first gate driving signal. The low side power switch is turned on and turned off alternately in response to the second gate driving signal.

In order to prevent the shoot-through caused by both the high side power switch and the low side power switch turning on at the same time, a dead time is added before the low side power switch is turned on. However, for high frequency switching converter, the on time of the power switch is a short pulse. For example, when the switching frequency of a buck converter is 18 MHz, each cycle is about 56 ns, and the on time (e.g., 15 ns) could be smaller than the control logic delay. As a result, a large current shoot-through may occur. Therefore it is desirable to provide a gate driver to control the turn on and turn off of the power switches to prevent the shoot-through.

SUMMARY OF THE INVENTION

According to an embodiment of the present disclosure, a gate driver circuit for a switching converter is provided. The gate driver circuit includes a high side driver circuit, a low side driver circuit, and an on-time control circuit. The high side driver circuit is configured to provide a first gate driving signal to a high side power switch of the switching converter. The low side driver circuit is configured to provide a second gate driving signal to a low side power switch of the switching converter. The on-time control circuit is configured to receive a first on-time control signal and a second feedback signal indicating a status of the second gate driving signal, and provide the first on-time adjusting signal in response to the first on-time control signal and the second feedback signal. The first gate driving signal is generated in response to the first on-time adjusting signal, and an on-time of the first on-time adjusting signal is greater than the on-time of the first on-time control signal. The on-time control circuit is further configured to receive a second on-time control signal and a first feedback signal indicating a status of the first gate driving signal, and provide the second on-time adjusting signal in response to the second on-time control signal and the second feedback signal. The second gate driving signal is generated in response to the second on-time adjusting signal, and an on-time of the second on-time adjusting signal is greater than the on-time of the second on-time control signal.

According to another embodiment of the present disclosure, a gate driver circuit for a switching converter is provided. The gate driver circuit includes a high side driver circuit, a low side driver circuit, and an on-time control circuit. The high side driver circuit is configured to provide a first gate driving signal to a high side power switch of the switching converter. The low side driver circuit is configured to provide a second gate driving signal to a low side power switch of the switching converter. The on-time control circuit is configured to receive a first on-time control signal and a first feedback signal indicating a status of the first gate driving signal, and provide the first on-time adjusting signal in response to the first on-time control signal and the first feedback signal. The first gate driving signal is generated in response to the first on-time adjusting signal. The on-time control circuit is further configured to receive a second on-time control signal and a second feedback signal indicating a status of the second gate driving signal, and provide the second on-time adjusting signal in response to the second on-time control signal and the second feedback signal. The second gate driving signal is generated in response to the second on-time adjusting signal.

According to yet another embodiment of the present disclosure, a gate driver circuit for a switching converter is provided. The gate driver circuit includes a high side driver circuit, a low side driver circuit, and an on-time control circuit. The high side driver circuit is configured to provide a first gate driving signal to a high side power switch of the switching converter. The low side driver circuit is configured to provide a second gate driving signal to a low side power switch of the switching converter. The on-time control circuit is configured to receive a first on-time control signal and a second feedback signal indicating a status of the second gate driving signal, and provide the first on-time adjusting signal in response to the first on-time control signal and the second feedback signal. The first gate driving signal is generated in response to the first on-time adjusting signal. The on-time control circuit is further configured to receive a second on-time control signal and a first feedback signal indicating a status of the first gate driving signal, and provide the second on-time adjusting signal in response to the second on-time control signal and the second on-time adjusting signal. The second gate driving signal is generated in response to the second on-time adjusting signal. The first feedback signal is generated in response to the first on-time adjusting signal and a first delay. The second feedback signal is generated in response to the second on-time adjusting signal and a second delay.

BRIEF DESCRIPTION OF THE DRAWINGS

The present disclosure can be further understood with reference to the following detailed description and appended drawings, where like elements are provided with like reference numerals. These drawings are only for illustration purpose, thus may only show part of the devices and are not necessarily drawn to scale.

DETAILED DESCRIPTION

Various embodiments of the present disclosure will now be described. In the following description, some specific details, such as example circuits and example values for these circuit components, are included to provide a thorough understanding of embodiments. One skilled in the relevant art will recognize, however, that the present disclosure can be practiced without one or more specific details, or with other methods, components, materials, etc. In other instances, well-known structures, materials, processes or operations are not shown or described in detail to avoid obscuring aspects of the present disclosure.

Throughout the specification and claims, the phrases "in one embodiment", "in some embodiments", "in one implementation", and "in some implementations" as used includes both combinations and sub-combinations of various features described herein as well as variations and modifications thereof. These phrases used herein do not necessarily refer to the same embodiment, although it may. Those skilled in the art should understand that the meanings of the terms identified above do not necessarily limit the terms, but merely provide illustrative examples for the terms. It is noted that when an element is "connected to" or "coupled to" the other element, it means that the element is directly connected to or coupled to the other element, or indirectly connected to or coupled to the other element via another element. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
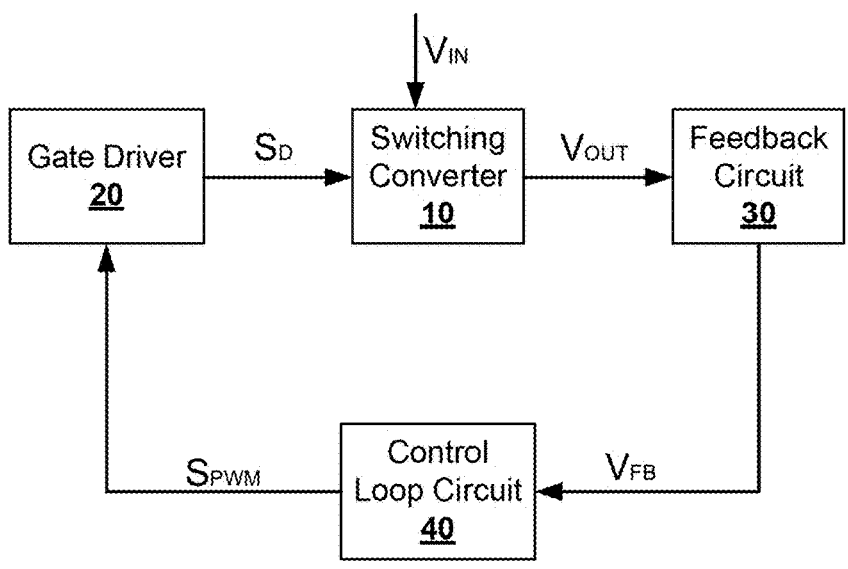
FIG. 1 is a block circuit diagram of a power converter in accordance with an embodiment of the present disclosure.

FIG. 1 is a block circuit diagram of a power converter 100 in accordance with an embodiment of the present disclosure. As shown in FIG. 1, the power converter 100 includes a switching converter 10, a gate driver 20, a feedback circuit 30 and a control loop circuit 40. The switching converter 10 has at least one power switch configured to covert an input voltage $V_{IN}$ into an output voltage $V_{OUT}$. In one embodiment, the switching converter 10 is a buck converter. In another embodiment, the switching converter 10 is a boost converter. In yet another embodiment, the switching converter 10 is a buck-boost converter. However, the present disclosure is not limited thereto. In various embodiments, the switching converter 10 may be any types of power converter.

The feedback circuit 30 is configured to receive the output voltage $V_{OUT}$ and provides a feedback signal $V_{FB}$ proportional to the output voltage $V_{OUT}$. The control loop circuit 40 is configured to receive the feedback signal $V_{FB}$ and provide a PWM control signal Spwm to the gate driver 20. Accordingly, the gate driver 20 is configured to provide the driving signal (e.g., SD) to at least one switch of the switching converter 10 in response to the PWM control signal SPWM.

Figure 2:
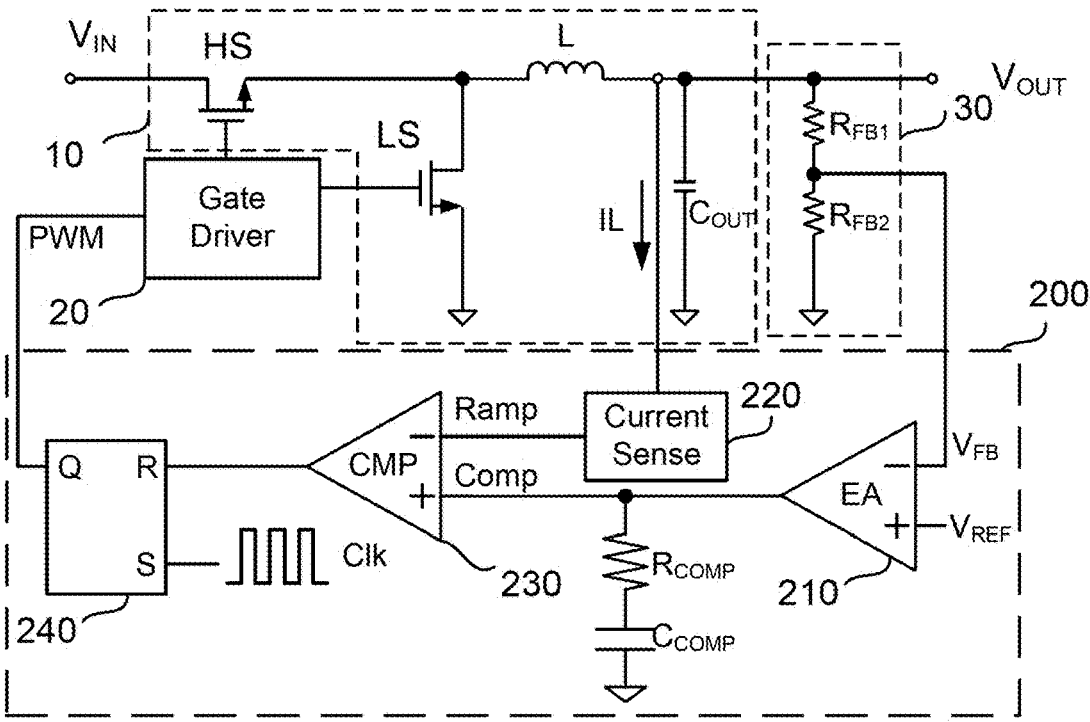
FIG. 2 is a schematic circuit diagram of a switching converter with a current mode control in accordance with an embodiment of the present disclosure.

FIG. 2 is a schematic circuit diagram of a switching converter 10 with a current mode control in accordance with an embodiment of the present disclosure. As shown in FIG. 2, the control loop circuit 200 includes a compensation circuit 210, a current sense ramp circuit 220, a comparison circuit 230, and a logic circuit 240. The compensation circuit 210 (e.g., an error amplifier EA) is configured to receive the feedback signal $V_{FB}$ and a reference signal $V_{REF}$, and generate a compensation signal Comp in response to the feedback signal $V_{FB}$ and the reference signal $V_{REF}$. The current sense ramp circuit 220 is configured to sense the inductor current IL and generate the ramp signal Ramp in response to the inductor current IL. In some embodiments, the slope compensation circuit is need to generate the ramp signal Ramp. The comparison circuit 230 (e.g., a comparator CMP) is configured to receive the compensation signal COMP and the ramp signal RAMP and provide a comparison signal. The logic circuit 240 (e.g., a SR latch) is configured to receive the comparison signal and a clock signal CLK and provide the PWM control signal PWM.

The switching converter 10 has at least one power switch configured to covert an input voltage $V_{IN}$ into an output voltage $V_{OUT}$ in response to a PWM control signal PWM. In one embodiment, the switching converter 10 is a buck converter. In another embodiment, the switching converter 10 is a boost converter. In yet another embodiment, the switching converter 10 is a buck-boost converter. However, the present disclosure is not limited thereto. In various embodiments, the switching converter 10 may be any types of power converter.

As shown in FIG. 2, the switching converter 10 includes a high side power switch HS and a low side power switch LS. In order to prevent the shoot-through caused by both the high side power switch HS and the low side power switch LS, whether the high/low side power switch is turned on needs to be detected. One way is to sense the current flowing through the high side power switches HS and low side power switch LS. However, for high frequency switching converter, using the current sense signal is not ideal as it has a long settling time. In one example, the switching frequency of the power converter is 18 MHZ, each cycle is about 56 ns. For such a short time, it is hard to sense the current with the settling time. Therefore, instead of sensing the current, the gate driving signal is detected.

Figures 3A, 3B:
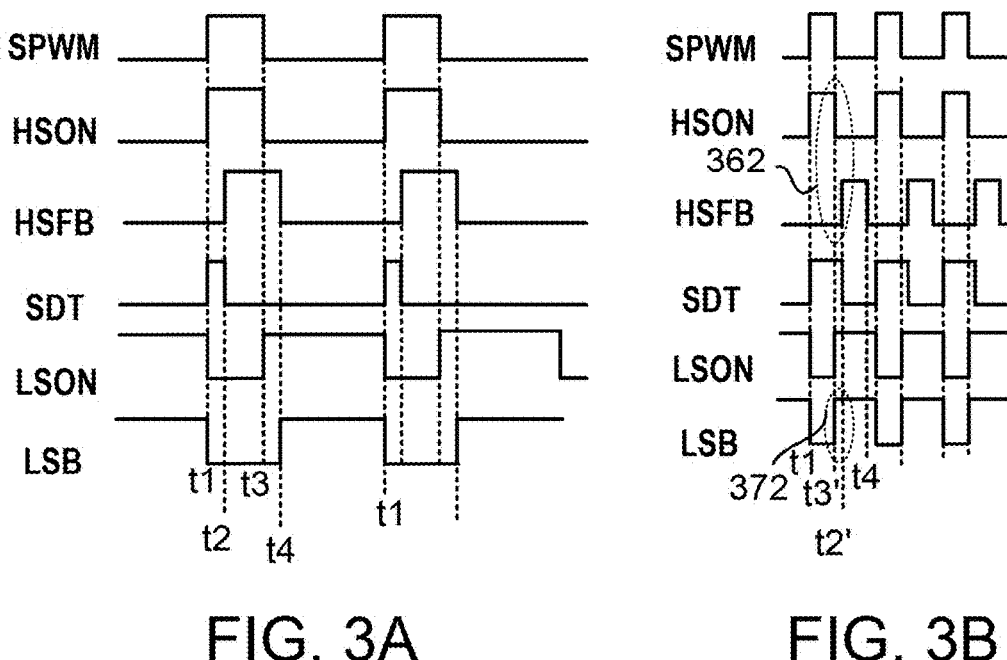
FIG. 3A shows a schematic diagram of simulated waveforms of signals of a gate driver circuit in accordance with an embodiment of the present disclosure.
FIG. 3B shows a schematic diagram of simulated waveforms of signals of a gate driver circuit in accordance with an embodiment of the present disclosure.

FIG. 3A shows a schematic diagram of simulated waveforms of signals of a gate driver circuit in accordance with an embodiment of the present disclosure. As shown in FIG. 3A, SPWM is the PWM control signal provided to a switching converter, HSON is the on-time control signal to control the high side power switch (e.g., HS as shown in FIG. 2), and the LSON is the on-time control signal to control the low side power switch (e.g., LS as shown in FIG. 2). In this embodiment, the gate driving signal (e.g., HSFB/LSFB) is detected to blank the opposite power switch (e.g., LS/HS) turning on. That is, when the high side power switch is turned on, the low side power switch could not be turned on. In this embodiment, the on-time control signal LSON is complementary of the on-time control signal HSON. However, in some implementations, a dead time is applied between the switching off one power switch and the switching on the other power switches. There is a delay existed in the control loop. Therefore, when the on-time control signal HSON transitions to a high logic level at time t1, the detected gate feedback signal HSFB transitions to the high logic level at time t2. Specifically, at the time t3 (i.e., the falling edge of the on-time control signal HSON), the detected gate driving signal HSFB is at the high logic level, and therefore the low side power switch LS would not be turned on (i.e., LSB at the low logic level). As a result, the low side power switch LS is controlled by the on-time control signal LSB to be turned on after time t3 (e.g., at time t4 with the detected gate driving signal HSFB. Therefore, there is no shoot-through.

However, when the switching frequency of a buck converter is 18 MHZ, each cycle is about 56 ns, and the on time (e.g., 15 ns) could be smaller than the control logic delay. As a result, a large current shoot-through may still occur between the high side power switch HS and the low side power switch LS. As shown in FIG. 3B, since the on-time of the power switch (e.g., HSON/LSON) is a short pulse, the detected gate feedback signal HSFB transitions to the high logic level at time t2', which is later than the time t3' when the on-time control signal HSON transitions to a low logic level. In other words, the delay (e.g., the time duration of the signal SDT at the high logic level) is longer than the on-time of the high side power switch M1, and thus shoot-through is triggered due to the gate feedback signal HSFB is delayed and not detected during time t3'-t2'. For example, as shown in FIG. 3B, since the gate feedback signal HSFB is delayed and is at the low logic level during time t3'-t2', the low side power switch LS is not blanked by the gate feedback signal HSFB. As a result, the low side power switch LS may be turned on at time t3', which overlaps with the falling edge of the on-time control signal HSON. Therefore, shoot-through occurs (e.g., as shown in 362 and 372). In other words, when the delay time is greater than the on-time of the power switch, shoot-through may occur as the falling edge of the gate driving signal overlap with the rising edge of the other gate driving signal since the gate driving signal is delayed and could not be detected.

Figure 4:
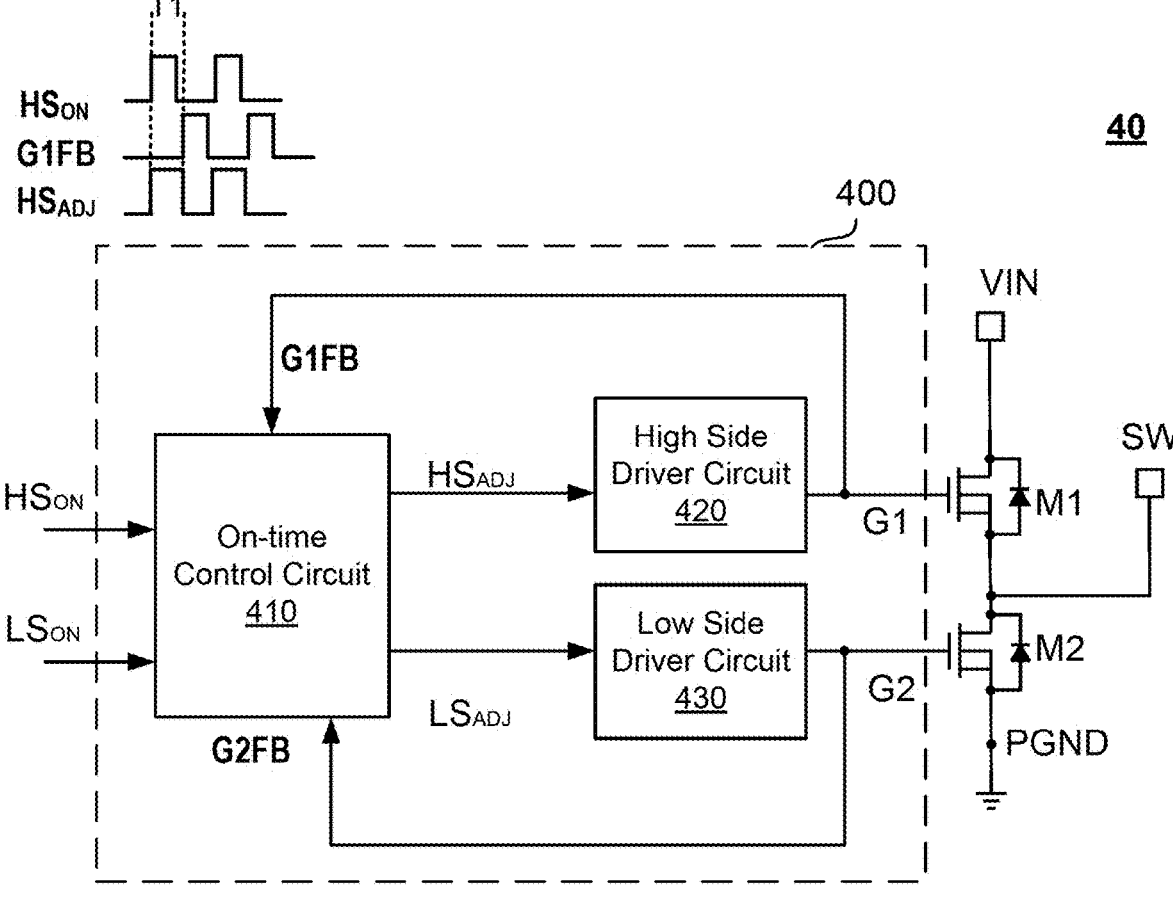
FIG. 4 is a schematic block diagram of a gate driver circuit for a switching converter in accordance with an embodiment of the present disclosure.

FIG. 4 is a schematic block diagram of a gate driver circuit 400 for a switching converter 30 in accordance with an embodiment of the present disclosure. In one embodiment, the switching converter 40 is a buck converter having a high side power switch and a low side power switch. In one embodiment, the power switches are Metal-Oxide-Semiconductor Field-Transistors (MOSFETs), and each MOSFET has a first terminal (e.g., drain), a second terminal (e.g., source), and a control terminal (e.g., gate). The MOSFET may be n-type or p-type. In one embodiment, the gate driving signal G1/G2 is at a high logic level to turn on the power switch (e.g., M1/M2), and the gate driving signal G1/G2 is at a low logic level to turn off the power switch (e.g., M1/M2). It should be noted that for an NMOS, a high voltage level ($V_{GS} \geq Vth$) is used to turn on the transistor M1/M2, and a low voltage level ($V_{GS} < Vth$) is used to turn off the M1/M2. For a PMOS, a low voltage level is used to turn on the transistor M1/M2, and a high voltage level is used to turn off the M1/M2.

The gate driver circuit 400 includes an on-time control circuit 410, a high side driver circuit 420, and a low side driver circuit 430. In this embodiment, the gate driving signal (e.g., G1/G2) is detected to blank the opposite power switch (e.g., M2/M1) turning on. Specifically, the on-time control circuit 410 is configured to receive an on-time control signal $HS_{ON}$ and a feedback signal indicating a status of the gate driving signal G2. In one embodiment, the feedback signal G2FB is detected by the gate driving signal G2. The on-time control circuit 410 provides the on-time adjusting signal $HS_{ADJ}$ in response to the on-time control signal $HS_{ON}$ and the feedback signal G2FB. The high side driver circuit 420 is configured to generate a gate driving signal G1 in response to the on-time adjusting signal $HS_{ADJ}$ and provide the gate driving signal G1 to the high side power switch M1. The on-time of the on-time adjusting signal $HS_{ADJ}$ is greater than the on-time of the on-time control signal $HS_{ON}$.

In one embodiment, a first on-time T1 is generated in response to the feedback signal G1FB and the on-time control signal $HS_{ON}$. For example, the on-time adjusting signal $HS_{ADJ}$ is generated by extending the on-time of the on-time control signal $HS_{ON}$ until the feedback signal G1FB is detected.

In another embodiment, a first delay D1 is applied to the feedback signal G1FB. For example, the on-time adjusting signal $HS_{ADJ}$ is generated by delaying of the feedback signal G1FB to blank the low side power switch LS.

The on-time control circuit 410 is further configured to receive an on-time control signal $LS_{ON}$ and a feedback signal indicating a status of the gate driving signal G1. In one embodiment, the feedback signal is the gate driving signal G1. The on-time control circuit 410 provides the on-time adjusting signal $LS_{ADJ}$ in response to the on-time control signal $LS_{ON}$ and the feedback signal G1FB. The low side driver circuit 430 is configured to generate a gate driving signal G2 in response to the on-time adjusting signal $LS_{ADJ}$, and provide the gate driving signal G2 to the low side power switch M2. The on-time of the on-time adjusting signal $LS_{ADJ}$ is greater than the on-time of the on-time control signal $LS_{ON}$.

In one embodiment, a second on-time T2 (not shown) is generated in response to the feedback signal G2FB and the on-time control signal $LS_{ON}$. Similarly, the on-time adjusting signal $LS_{ADJ}$ is generated by extending the on-time of the on-time control signal $LS_{ON}$ until the feedback signal G2FB is detected.

In another embodiment, a second delay D2 is applied to the feedback signal G2FB. For example, the on-time adjusting signal $LS_{ADJ}$ is generated by delaying of the feedback signal G2FB to blank the high side power switch HS.

Figure 5:
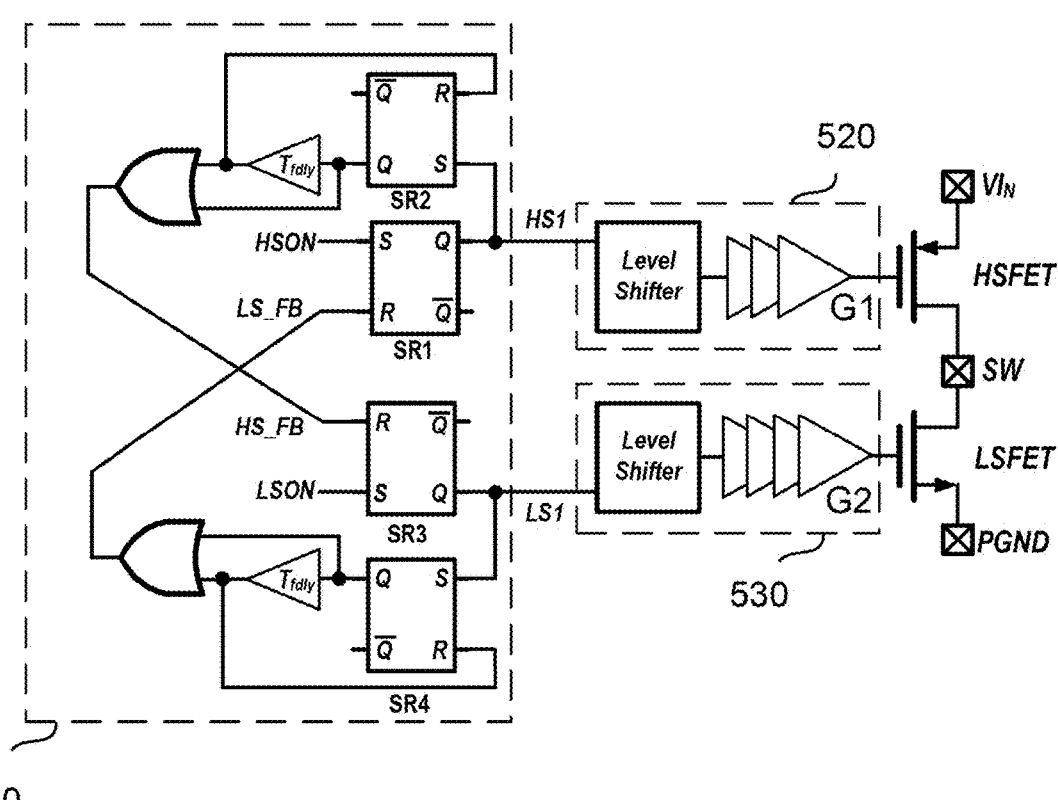
FIG. 5 is a schematic block diagram of a gate driver circuit for a switching converter in accordance with another embodiment of the present disclosure.

FIG. 5 is a schematic block diagram of a gate driver circuit 500 for a switching converter in accordance with another embodiment of the present disclosure. As shown in FIG. 5, the gate driver circuit 500 includes an on-time control circuit 510, a high side driver circuit 520, and a low side driver circuit 530.

In one embodiment, the driver circuit 520/530 includes a level shifter and inverter circuits. In this embodiment, the on-time control circuit 510 provides a delay feedback type. In one embodiment, the on-time control circuit 510 includes a logic circuit (e.g., 4 SR latches SR1-SR4). For example, the set terminal of the SR latch SR1 receives the on-time control signal $HS_{ON}$, and the SR latch SR1 is reset by the feedback signal LS_FB indicating the status of the gate driving signal G2, and the SR latch SR1 provides the on-time adjusting signal HS1. Additional latch is added on both the high side control and the low side control to make sure the high/low side switch is turned on longer than the propagation delay to avoid the shoot-through.

Specifically, the set terminal of the SR latch SR2 receives the on-time adjusting signal HS1, and the SR latch SR2 provides the output signal to a delay circuit $T_{fdly}$. The delay circuit $T_{fdly}$ is configured to extend the pulse of a signal. In one implementation, the falling delay is extended. For instance, the delay circuit is realized by CMOS inverter with RC circuit. The delayed output signal is used to reset the SR latch S2. An OR gate receives the output signal of the SR latch SR2 and the delayed output signal and generates the feedback signal HS_FB indicating the status of the gate driving signal G1. In other words, the on-time of the on-time control signal HSON is extended as the feedback signal HS_FB to blank the low side power switch LSFET. In one implementation, a first delay time D1 is applied to the output signal, and therefore the feedback signal HS_FB is extended by the first delay time D1. The on-time adjusting signal LS1 transitions to a low logic level to turn off the low side power switch LSFET when a high logic level of the feedback signal HS_FB is received. Therefore, the low side power switch LSFET would not be turned on until the falling edge of HS_FB is detected (i.e., after the high side power switch HSFET is turned off).

Figure 6:
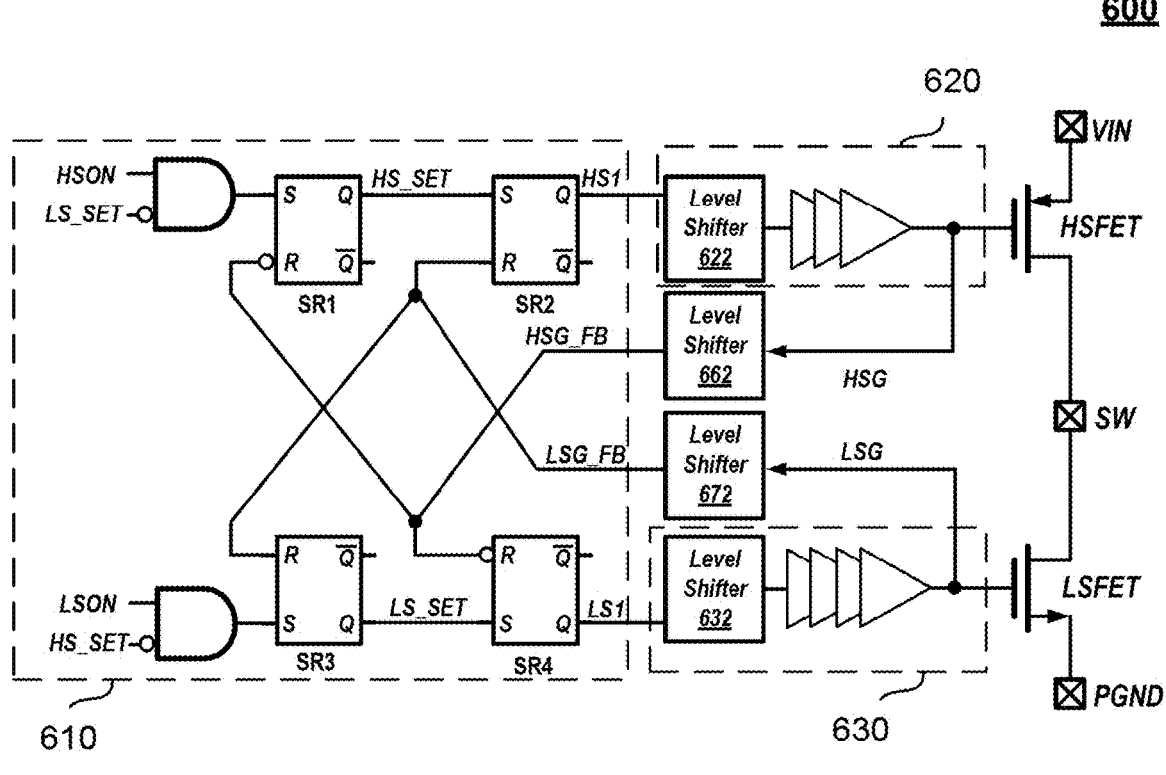
FIG. 6 is a schematic block diagram of a gate driver circuit for a switching converter in accordance with yet another embodiment of the present disclosure.

FIG. 6 is a schematic block diagram of a gate driver circuit 600 for a switching converter in accordance with yet another embodiment of the present disclosure. In this embodiment, the on-time control circuit 610 includes a logic circuit including 4 SR latches SR1-SR4. In one embodiment, the gate driver circuit 600 further includes level shifters 622, 632, 662, and 672. In this embodiment, both the gate driving signals HSG and LSG are detected to make sure that each power switch will be turned on/off to prevent from shoot-through. For instance, for the high side gate control circuit, not only the gate feedback signal of the low side power switch LSFET, i.e., LSG_FB is detected, additional latch SR1 is added to detect the gate feedback signal of the high side power switch HSFET, i.e., HSG_FB. When the high side power switch HSFET is turned on (e.g., HSON at the high logic level), before the gate feedback signal HSG_FB transitions to a high logic level, the high side power switch HSFET cannot be turned off to ensure that the high side power switch HSFET should be turned on (i.e., the low side power switch LSFET should be turned off) during the propagation delay of the control logic caused by the level shifter 672. In other words, even when the on-time control signal HSON transitions to a low logic level, and the gate feedback signal HSG_FB still remains at a low logic level due to the propagation delay, the high side power switch HSFET is turned on (i.e., the low side switch is turned off) according to the driver signal HS1 to avoid the shoot-through. On the other hand, the SR latch SR4 is reset by the gate feedback signal HSG_FB. In other words, after the falling edge of HSG_FB is detected (i.e., after the high side power switch HSFET is turned off), the low side power switch LSFET could be turned on. Therefore, the gate driver circuit 600 of the present disclosure prevents the shoot-through without knowing the exact propagation delay of the control logic.

As shown in FIG. 6, the SR latch S1 receives the on-time control signal HSON and is reset by the gate feedback signal HSG_FB, and generates a set signal HS_SET. Optionally, an AND gate is used to receive the on-time control signal HSON and the inverted set signal LS_SET generated by the SR latch S3. Specifically, after the delayed gate feedback signal LSG_FB is received, the SR latch SR1 is reset. That is, the on-time of the set signal HS_SET is extended such that the SR latch SR2 could be reset by the gate feedback signal LSG_FB of the low side power switch LSFET. In one implementation, the SR latches SR1 and SR3 are realized by NOR gates. In one implementation, the SR latches SR2 and SR4 are realized by NAND gates.

It should be noted that since the HSFET is a PMOS, the gate feedback signal HSG_FB is inverted to reset the SR latches SR1 and SR4, as shown in FIG. 6.

Figure 7:
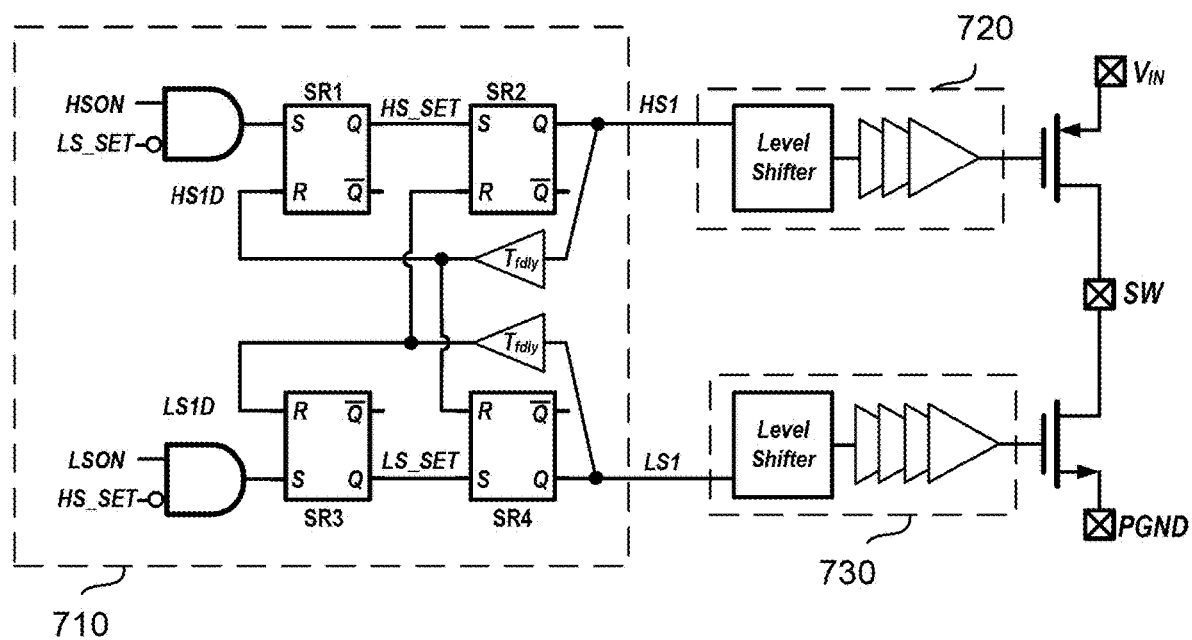
FIG. 7 is a schematic block diagram of a gate driver circuit for a switching converter in accordance with yet another embodiment of the present disclosure.

FIG. 7 is a schematic block diagram of a gate driver circuit 700 for a switching converter in accordance with yet another embodiment of the present disclosure. In this embodiment, instead of detecting the gate driving signal, a delay circuit $T_{fdly}$ is configured to extend the pulse of the driver signal HS1 to generate the feedback signal HS1D. In one implementation, the falling delay is extended. The SR latch SR1 is reset by the feedback signal HS1D. That is, the on-time of the set signal HS_SET is extended such that the SR latch SR2 could be reset by the feedback signal LS1D of the low side power switch LSFET.

It should be understood that, the control circuit and the related components, circuit structures, signals, and wave-forms described or shown above in the present disclosure are only for illustration purpose. However, the present disclosure is not limited thereto. Persons having ordinary skill in the art may understood that the control circuit of the present disclosure could be realized, according to practical applica-tions, by any other circuits with different circuit structures, and thus controlled by different types of the corresponding signals to achieve the corresponding functions. For example, the gate driver circuit and the logic circuit could be realized by a digital circuit, an analog circuit, a software, an auto-matic generation circuit by hardware description language, or a combination of the above.

Based on the above, the present disclosure provides various gate driver circuits for switching converter and control method thereof to prevent the shoot-through. It will be appreciated by persons skilled in the art that the present disclosure is not limited to what has been particularly shown and described herein above. Rather the scope of the present disclosure is defined by the claims and includes both com-binations and sub-combinations of the various features described hereinabove as well as variations and modifica-tions thereof which would occur to persons skilled in the art upon reading the foregoing description and which are not in the prior art.

What is claimed is:

1. A gate driver circuit for a switching converter, and the gate driver circuit comprises:

a high side driver circuit configured to provide a first gate driving signal to a high side power switch of the switching converter;

a low side driver circuit configured to provide a second gate driving signal to a low side power switch of the switching converter; and an on-time control circuit configured to receive a first on-time control signal and a second feedback signal indicating a status of the second gate driving signal, and provide the first on-time adjusting signal in response to the first on-time control signal and the second feedback signal, wherein the first gate driving signal is generated in response to the first on-time adjusting signal, and an on-time of the first on-time adjusting signal is greater than the on-time of the first on-time control signal;

wherein the on-time control circuit is further configured to receive a second on-time control signal and a first feedback signal indicating a status of the first gate driving signal, and provide the second on-time adjusting signal in response to the second on-time control signal and the second feedback signal, wherein the second gate driving signal is generated in response to the second on-time adjusting signal, and an on-time of the second on-time adjusting signal is greater than the on-time of the second on-time control signal.

2. The gate driver circuit of claim 1, wherein the on-time control circuit is further configured to generate a first on-time in response to the first feedback signal and the first on-time control signal.

3. The gate driver circuit of claim 2, wherein the on-time control circuit is further configured to generate a first set signal, wherein the first set signal is at a high logic level when the first on-time control signal is at the high logic level, and the first set signal transitions to a low logic level when a high logic level of the first feedback signal is received, wherein the first on-time adjusting signal is at the high logic level when the first set signal is at the high logic level, and the first on-time adjusting signal transitions to the low logic level when the high logic level of the second feedback signal is received, wherein the high side power switch is turned on in response to the high logic level of the first on-time adjusting signal, and turned off in response to the low logic level of the first on-time adjusting signal.

4. The gate driver circuit of claim 1, wherein the on-time control circuit is further configured to generate a second on-time in response to the second feedback signal and the second on-time control signal.

5. The gate driver circuit of claim 4, wherein the on-time control circuit is further configured to generate a second set signal, where in the second set signal is at a high logic level when the second on-time control signal is at the high logic level, and the second set signal transitions to a low logic level when a high logic level of the second feedback signal is received, wherein the second on-time adjusting signal is at the high logic level when the second set signal is at the high logic level, and the second on-time adjusting signal transitions to the low logic level when the high logic level of the first feedback signal is received, wherein the low side power switch is turned on in response to the high logic level of the second on-time adjusting signal, and turned off in response to the low logic level of the second on-time adjusting signal.

6. The gate driver circuit of claim 1, wherein the on-time control circuit comprises:

a first delay circuit configured to receive the first on-time adjusting signal and provide the first feedback signal; and a second delay circuit configured to receive the second on-time adjusting signal and provide the second feedback signal.

7. The gate driver circuit of claim 1, wherein the on-time control circuit comprises:

a first logic circuit having a first input terminal configured to receive the first on-time control signal, a second input terminal configured to receive the first feedback signal, and an output terminal configured to provide a first set signal;

a second logic circuit having a first input terminal configured to receive the first set signal, a second input terminal configured to receive the second feedback signal, and an output terminal configured to provide the first on-time adjusting signal;

a third logic circuit having a first input terminal configured to receive the second on-time control signal, a second input terminal configured to receive the second feedback signal, and an output terminal configured to provide a second set signal; and a fourth logic circuit having a first input terminal configured to receive the second set signal, a second input terminal configured to receive the first feedback signal, and an output terminal configured to provide the second on-time adjusting signal.

8. The gate driver circuit of claim 1, wherein the first on-time adjusting signal is at a high logic level when the first on-time control signal is at the high logic level, and the first on-time adjusting signal transitions to a low logic level when a high logic level of the second feedback signal is received, wherein the second feedback signal is generated in response to the second on-time adjusting signal and a second delay, wherein the high side power switch is turned on in response to the high logic level of the first on-time adjusting signal, and turned off in response to the low logic level of the first on-time adjusting signal.

9. The gate driver circuit of claim 1, wherein the second on-time adjusting signal is at a high logic level when the second on-time control signal is at the high logic level, and the second on-time adjusting signal transitions to a low logic level when the high logic level of the first feedback signal is received, wherein the first feedback signal is generated in response to the first on-time adjusting signal and a first delay, wherein the low side power switch is turned on in response to the high logic level of the second on-time adjusting signal, and turned off in response to the low logic level of the second on-time adjusting signal.

10. The gate driver circuit of claim 1, wherein the on-time control circuit comprises:

a first logic circuit having a first input terminal configured to receive the first on-time control signal, a second input terminal configured to receive the second feedback signal, and an output terminal configured to provide the first on-time adjusting signal;

a second logic circuit having a first input terminal configured to receive the first on-time adjusting signal, a second input terminal configured to receive a first delay, and an output terminal configured to provide the first feedback signal;

a third logic circuit having a first input terminal configured to receive the second on-time control signal, a second input terminal configured to receive the first feedback signal, and an output terminal configured to provide the second on-time adjusting signal; and a fourth logic circuit having a first input terminal configured to receive the second on-time adjusting signal, a second input terminal configured to receive a second delay, and an output terminal configured to provide the second feedback signal.

11. A gate driver circuit for a switching converter, and the gate driver circuit comprises:

a high side driver circuit configured to provide a first gate driving signal to a high side power switch of the switching converter;

a low side driver circuit configured to provide a second gate driving signal to a low side power switch of the switching converter; and an on-time control circuit configured to receive a first on-time control signal and a first feedback signal indicating a status of the first gate driving signal, and provide the first on-time adjusting signal in response to the first on-time control signal and the first feedback signal, wherein the first gate driving signal is generated in response to the first on-time adjusting signal;

wherein the on-time control circuit is further configured to receive a second on-time control signal and a second feedback signal indicating a status of the second gate driving signal, and provide the second on-time adjusting signal in response to the second on-time control signal and the second feedback signal, wherein the second gate driving signal is generated in response to the second on-time adjusting signal.

12. The gate driver circuit of claim 11, further comprising:

a first level shifter configured to receive the first gate driving signal and provide the first feedback signal; and a second level shifter configured to receive the second gate driving signal and provide the second feedback signal.

13. The gate driver circuit of claim 11, wherein the first on-time adjusting signal is at a high logic level when the first on-time control signal is at the high logic level, and the first on-time adjusting signal transitions to a low logic level when a high logic level of the first feedback signal is received.

14. The gate driver circuit of claim 13, wherein the on-time control circuit is further configured to generate a first driver signal, the first driver signal is at the high logic level when the first on-time adjusting signal is at the high logic level, and the first driver signal transitions to the low logic level when the high logic level of the second feedback signal is received, wherein the high side power switch is turned on in response to the high logic level of the first driver signal, and turned off in response to the low logic level of the first driver signal.

15. The gate driver circuit of claim 11, wherein the on-time control circuit comprises:

a first logic circuit having a first input terminal configured to receive the first on-time control signal, a second input terminal configured to receive the first feedback signal, and an output terminal configured to provide the first on-time adjusting signal;

a second logic circuit having a first input terminal configured to receive the first on-time adjusting signal, a second input terminal configured to receive the second feedback signal, and an output terminal configured to provide a first driver signal;

a third logic circuit having a first input terminal configured to receive the second on-time control signal, a second input terminal configured to receive the second feedback signal, and an output terminal configured to provide the second on-time adjusting signal; and a fourth logic circuit having a first input terminal configured to receive the second on-time adjusting signal, a second input terminal configured to receive the first feedback signal, and an output terminal configured to provide a second driver signal.

16. The gate driver circuit of claim 15, wherein the on-time control circuit further comprises:

a first delay circuit configured to receive the first driver signal and provide the first feedback signal; and a second delay circuit configured to receive the second driver signal and provide the second feedback signal.

17. The gate driver circuit of claim 11, wherein the second on-time adjusting signal is at a high logic level when the second on-time control signal is at the high logic level, and the second on-time adjusting signal transitions to a low logic level when a high logic level of the second feedback signal is received.

18. The gate driver circuit of claim 17, wherein the on-time control circuit is further configured to generate a second driver signal, the second driver signal is at the high logic level when the second on-time adjusting signal is at the high logic level, and the second driver signal transitions to a low logic level when the high logic level of the first feedback signal is received, wherein the low side power switch is turned on in response to the high logic level of the second driver signal, and turned off in response to the low logic level of the second driver signal.

19. A gate driver circuit for a switching converter, and the gate driver circuit comprises:

a high side driver circuit configured to provide a first gate driving signal to a high side power switch of the switching converter;

a low side driver circuit configured to provide a second gate driving signal to a low side power switch of the switching converter; and an on-time control circuit configured to receive a first on-time control signal and a second feedback signal indicating a status of the second gate driving signal, and provide the first on-time adjusting signal in response to the first on-time control signal and the second feedback signal, wherein the first gate driving signal is generated in response to the first on-time adjusting signal;

wherein the on-time control circuit is further configured to receive a second on-time control signal and a first feedback signal indicating a status of the first gate driving signal, and provide the second on-time adjusting signal in response to the second on-time control signal and the second on-time adjusting signal, wherein the second gate driving signal is generated in response to the second on-time adjusting signal;

wherein the first feedback signal is generated in response to the first on-time adjusting signal and a first delay; and wherein the second feedback signal is generated in response to the second on-time adjusting signal and a second delay.

20. The gate driver circuit of claim 19, wherein the first on-time adjusting signal is at a high logic level when the first on-time control signal is at the high logic level, and the first on-time adjusting signal transitions to a low logic level when a high logic level of the second feedback signal is received, wherein the high side power switch is turned on in response to the high logic level of the first on-time adjusting signal, and turned off in response to the low logic level of the first on-time adjusting signal.

21. The gate driver circuit of claim 20, wherein the second feedback signal is at the high logic level when the second on-time adjusting signal is at the high logic level, and the second feedback signal transitions to the low logic level in response to the second delay.

22. The gate driver circuit of claim 19, wherein the second on-time adjusting signal is at a high logic level when the second on-time control signal is at the high logic level, and the second on-time adjusting signal transitions to a low logic level when the high logic level of the first feedback signal is received, wherein the low side power switch is turned on in response to the high logic level of the second on-time adjusting signal, and turned off in response to the low logic level of the second on-time adjusting signal.

23. The gate driver circuit of claim 22, wherein the first feedback signal is at the high logic level when the first on-time adjusting signal is at the high logic level, and the first feedback signal transitions to the low logic level in response to the first delay.

24. The gate driver circuit of claim 19, wherein the on-time control circuit comprises:

a first logic circuit having a first input terminal configured to receive the first on-time control signal, a second input terminal configured to receive the second feedback signal, and an output terminal configured to provide the first on-time adjusting signal;

a second logic circuit having a first input terminal configured to receive the first on-time adjusting signal, a second input terminal configured to receive a first delay, and an output terminal configured to provide the first feedback signal;

a third logic circuit having a first input terminal configured to receive the second on-time control signal, a second input terminal configured to receive the first feedback signal, and an output terminal configured to provide the second on-time adjusting signal; and a fourth logic circuit having a first input terminal configured to receive the second on-time adjusting signal, a second input terminal configured to receive a second delay, and an output terminal configured to provide the second feedback signal.

* * * * *